(12) United States Patent
Uya

(10) Patent No.: US 7,075,164 B2
(45) Date of Patent: Jul. 11, 2006

(54) SEMICONDUCTOR PHOTOELECTRIC CONVERSION DEVICE SUITABLE FOR MINIATURIZATION

(75) Inventor: Shinji Uya, Miyagi (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/299,757

(22) Filed: Nov. 20, 2002

(65) Prior Publication Data

US 2003/0122209 A1 Jul. 3, 2003

(30) Foreign Application Priority Data

Dec. 28, 2001 (JP) ............................. 2001-400665

(51) Int. Cl.
*H01L 27/14* (2006.01)
*H01L 31/00* (2006.01)

(52) U.S. Cl. .................... 257/431; 257/432; 257/434; 257/435; 257/437

(58) Field of Classification Search ........ 257/240–284, 257/431–435, 232, 437, 444, 637, 640
See application file for complete search history.

(56) References Cited

U.S. PATENT DOCUMENTS

| | | | | |
|---|---|---|---|---|
| 4,845,375 A | * | 7/1989 | Tsushima ................... 250/578 |
| 5,371,397 A | * | 12/1994 | Maegawa et al. ........... 257/432 |
| 5,583,354 A | | 12/1996 | Ishibe ........................ 257/232 |
| 5,585,653 A | * | 12/1996 | Nakashiba .................. 257/232 |
| 5,593,913 A | * | 1/1997 | Aoki .......................... 437/53 |
| 5,763,999 A | * | 6/1998 | Matsuno et al. ............ 313/573 |
| 5,986,704 A | | 11/1999 | Asai et al. .................. 348/340 |
| 6,066,511 A | | 5/2000 | Fukusyo ..................... 438/60 |
| 6,069,350 A | | 5/2000 | Ohtsuka et al. ............ 250/208.1 |
| 6,081,018 A | * | 6/2000 | Nakashiba et al. ......... 257/435 |
| 6,255,640 B1 | * | 7/2001 | Endo et al. ................ 250/208.1 |
| 6,468,826 B1 | * | 10/2002 | Murakami et al. .......... 438/48 |
| 2001/0033007 A1 | * | 10/2001 | Lee ............................ 257/432 |
| 2001/0042875 A1 | * | 11/2001 | Yoshida ...................... 257/291 |
| 2002/0048840 A1 | * | 4/2002 | Tanigawa ................... 438/65 |
| 2002/0134420 A1 | * | 9/2002 | Kyoda et al. .............. 136/220 |
| 2002/0195628 A1 | * | 12/2002 | Yamada ...................... 257/290 |

FOREIGN PATENT DOCUMENTS

| | | |
|---|---|---|
| EP | 0 242 663 A2 | 10/1987 |
| EP | 0 441 594 A2 | 8/2001 |
| JP | 03-283572 | 12/1991 |

(Continued)

OTHER PUBLICATIONS

"A 1/3-in 270 000 Pixel CCD Image Sensor," Kuriyama et al., *IEEE Transactions on Electron Devices*, vol. 38, No. 5, pp. 949-953 (May 1991).

(Continued)

*Primary Examiner*—Mary Wilczewski
*Assistant Examiner*—Monica Lewis
(74) *Attorney, Agent, or Firm*—Arent Fox PLLC

(57) ABSTRACT

A semiconductor photoelectric conversion device includes: a number of photoelectric conversion elements formed in a principal surface of the semiconductor substrate; functional devices formed in the semiconductor substrate adjacent to photoelectric conversion elements; a light shielding film formed above the semiconductor substrate for shielding light above the functional devices and having a window above each photoelectric conversion element; and an effective wavelength shortening member disposed in the windows, and being made of transmissive material having a high refractive index, thereby shortening an effective wavelength of light passing through the windows.

22 Claims, 12 Drawing Sheets

FOREIGN PATENT DOCUMENTS

| | | |
|---|---|---|
| JP | 05-095098 | 4/1993 |
| JP | 08-321595 | 12/1996 |

OTHER PUBLICATIONS

"A 1" Format 1.5M Pixel IT-CCD Image Sensor for an HDTV Camera System," Sakakibara et al., *IEEE Transactions on Consumer Electronics*, vol. 37, No. 3, pp. 487-493 (Aug. 1991).

European Search Report for EP 02027498 dated Nov. 16, 2004.

* cited by examiner

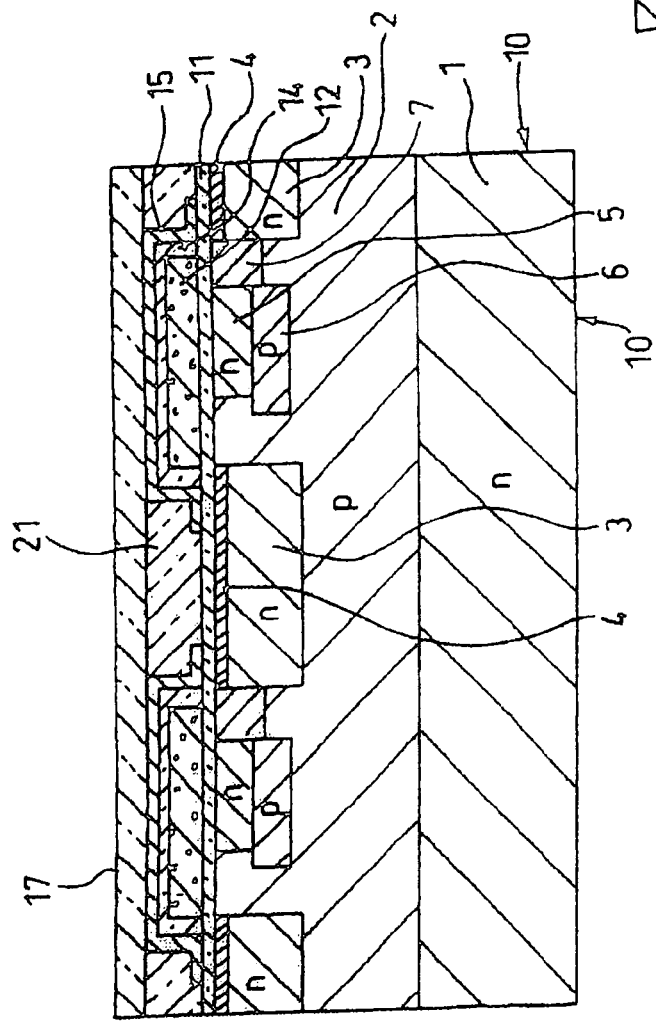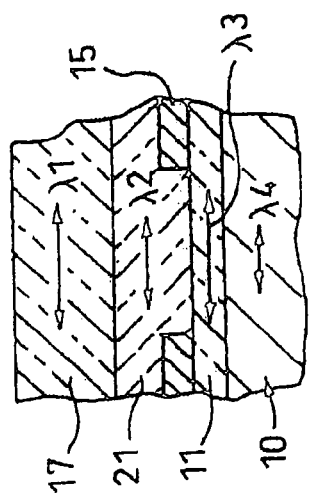

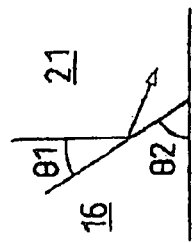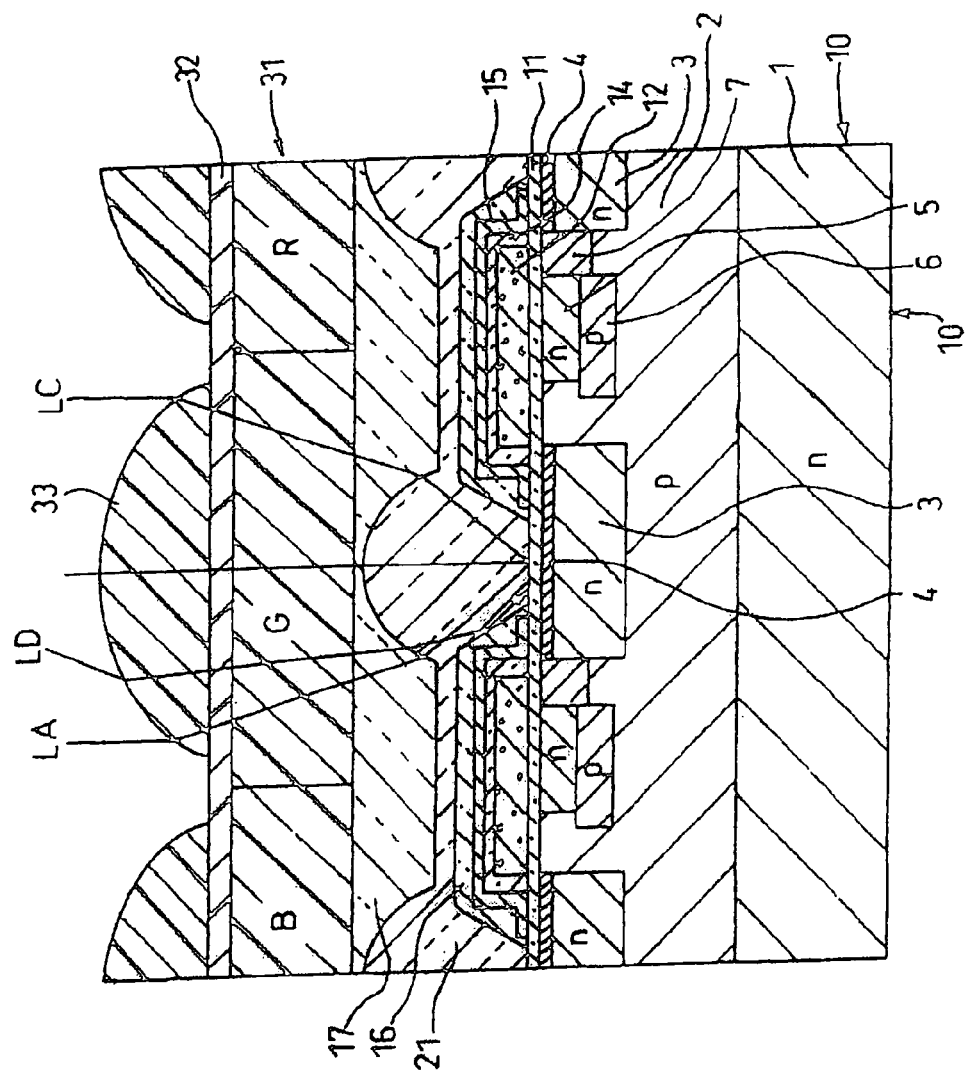

SEMICONDUCTOR PHOTOELECTRIC CONVERSION DEVICE SUITABLE FOR MINIATURIZATION

CROSS REFERENCE TO RELATED APPLICATION

This application is based on Japanese Patent Application No. 2001-400665, filed on Dec. 28, 2001, the entire contents of which are incorporated herein by reference.

BACKGROUND OF THE INVENTION

A) Field of the Invention

The present invention relates to a photoelectric conversion device, and more particularly to a semiconductor photoelectric conversion device suitable for miniaturization.

B) Description of the Related Art

Most of semiconductor photoelectric conversion devices use a pn junction diode as a photoelectric conversion element and read accumulated electrons to generate a signal representative of the amount of received light. When light becomes incident upon a pn junction diode, photoelectric conversion occurs to generate pairs of electron-hole and electrons are accumulated in an n-type region.

In a CCD semiconductor photoelectric conversion device, accumulated electrons are transferred by charge transfer channel CCDs and amplified by an output amplifier to acquire image signals. In a MOS semiconductor photoelectric conversion device, accumulated charges are amplified by a MOS transistor and picked up via a wiring line. In both the cases, functional devices such as CCDs and transistors are disposed near at a pn junction diode or photoelectric conversion element.

These functional devices include pn junction diodes which generate charges corresponding to the amount of incident light. It is desirable that these charges are eliminated because they add noises to the light reception signal obtained from the pn junction diode. In order to eliminate the charges, a light shielding film is disposed above a semiconductor substrate. The light shielding film has a light transmission window above each photoelectric conversion element and shields light which otherwise enters the peripheral functional devices.

A micro lens is disposed above the light shielding film in order to make light passed through a taking lens efficiently enter each photoelectric conversion element. Incident light passed through the micro lens is converged and enters the widow of the light shielding film. If the micro lens does not exist, light is guided to the window in order not to allow the light to enter the light shielding film and become invalid incidence light to thereby improve photoelectric conversion efficiency.

An example of prior art will be described with reference to the accompanying drawings.

FIG. 10A is a schematic cross sectional view showing the structure of a CCD semiconductor photoelectric conversion device according to the prior art. A silicon substrate 10 has a p-type layer 2 on an n-type region 1. The p-type layer 2 has an n-type region 3 constituting a photodiode and an n-type region 5 constituting a vertical charge transfer channel VCCD. On the n-type region 3, a $p^+$-type region 4 is formed to bury the photodiode. A p-type region 6 is formed on the bottom surface of the n-type region 5 to electrically separate the vertical charge transfer channel, and a $p^+$-type region 7 functioning as a channel stopper is formed between adjacent columns.

On the surface of a silicon substrate 10, a silicon oxide film 11 thermally oxidized is formed. On the silicon oxide film 11, a charge transfer electrode 12 of a so-called double polysilicon structure is formed to drive the vertical charge transfer channel. The upper space of the photodiode is made open in order to introduce light. After the surface of the charge transfer electrode 12 is covered with a silicon oxide layer 14, a light shielding film 15 made of tungsten or the like is formed, the light shielding film having a window above each photodiode.

An insulating layer 17 having a flat surface is formed covering the light shielding film 15, the insulating layer being made of a boron—phosphorous—silicon oxide (borophosphosilicate glass, BPSG) or the like. Color filters 31 are formed on the insulating layer 17. The color filter layer 31 is covered with a surface planarizing layer 32 such as resist, and thereafter micro lenses 33 are formed on the surface of the surface planarizing layer 32 by using resist material or the like.

With these processes, a semiconductor photoelectric conversion device with color filters is formed. Color filters are omitted for a three-plate type photoelectric conversion device. Incidence light upon the photodiode is limited by the light shielding film, and only the light passed through the window of the light shielding film can enter the photodiode.

FIG. 10B is a plan view showing an example of the layout of a semiconductor image pickup device. A number of photodiodes PD are disposed in rows and columns in a tetragonal matrix shape. A vertical charge transfer channel VCCD is formed adjacent to each photodiode column. A horizontal charge transfer channel HCCD is coupled to one ends of the vertical charge transfer channels VCCDs.

FIG. 10C is a plan view showing another example of the layout of a semiconductor image pickup device. A number of photodiodes PD are disposed shifted by a half pitch in the row and column directions, and has a so-called honeycomb layout. VCCD extends in a zigzag way between pixels of the honeycomb structure.

FIG. 11 is a schematic cross sectional view showing the structure of another CCD semiconductor photoelectric conversion device according to the prior art. As compared to the structure shown in FIG. 10A, a low refractive index insulating layer 18 and a high refractive index insulating layer 19 are inserted between the light shielding film 15 and insulating layer 17. The high refractive index insulating layer 19 has a downward convex shape to provide a lens function.

FIGS. 12A, 12B, 12C and 12D show the results of optical path calculations of the structures shown in FIGS. 10A and 11. FIGS. 12A and 12B show the calculation results of the structure shown in FIG. 10A when incidence light enters at an incidence angle of 0 and 10 degrees. FIGS. 12C and 12D show the calculation results of the structure shown in FIG. 11 when incidence light enters at an incidence angle of 0 and 10 degrees. In the structure shown in FIG. 10A, as the incidence angle becomes oblique, the incidence light enters not only the window of the light shielding film but also other regions so that the efficiency lowers.

If each pixel of a photoelectric conversion device is made small by proportionally reducing the size of constituent elements, it is expected that the sensitivity proportional to a pixel size is obtained without lowering the sensitivity per unit area. However, there is the phenomenon that as the opening size of a light shielding film is reduced, the sensitivity lowers at a higher rate than the reduction rate of the pixel size. This phenomenon that the sensitivity lowers at a higher rate than the reduction rate of a light reception area becomes conspicuous as the incidence angle becomes large.

SUMMARY OF THE INVENTION

An object of this invention is to provide a semiconductor photoelectric conversion device suitable for reducing a pixel size.

Another object of the invention is to prevent the sensitivity of a semiconductor photoelectric conversion device from being lowered as the pixel size is made small.

According to one aspect of the present invention, there is provided a semiconductor photoelectric conversion device, comprising: a semiconductor substrate having a principal surface; a number of photoelectric conversion elements formed in the principal surface of the semiconductor substrate; functional devices formed in the principal surface of the semiconductor substrate adjacent to a plurality of the photoelectric conversion elements; a light shielding film formed above the semiconductor substrate, the light shielding film shielding light above the functional devices and having windows for opening an upper space of a predetermined region of each of the photoelectric conversion elements; and an effective wavelength shortening member disposed in at least some of the windows above the semiconductor substrate, the effective wavelength shortening member being made of transmissive material having a refractive index higher than a refractive index of silicon oxide and shortening an effective wavelength of light passing through the windows.

As above, an effective wavelength of light in a size-reduced opening of a semiconductor photosensitive device is shortened to improve the light reception efficiency of a photodiode.

BRIEF DESCRIPTION OF THE DRAWINGS

FIGS. 1A and 1B are schematic cross sectional views of a semiconductor photoelectric conversion device according to an embodiment of the invention.

FIG. 5A is a schematic cross sectional view of a semiconductor photoelectric conversion device according to an embodiment of the invention, and FIG. 5B is a diagram showing how light travels at an interface between a high refractive index transmissive material layer and a transmissive material layer.

DESCRIPTION OF THE PREFERRED EMBODIMENTS

Figure 2:
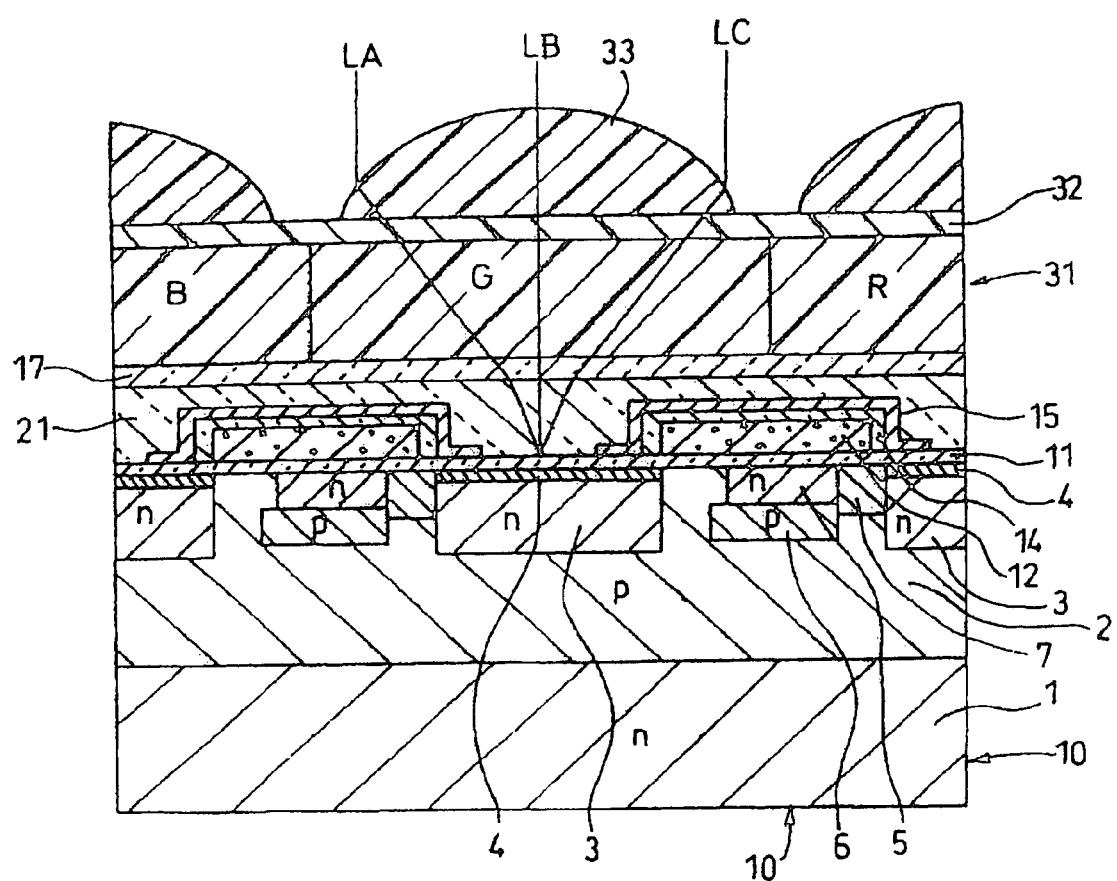
FIG. 2 is a schematic cross sectional view of a semiconductor photoelectric conversion device according to another embodiment of the invention.

Embodiments of the invention will be described with reference to the accompanying drawings, by taking as an example a CCD semiconductor image pickup device. Like elements to those of a conventional device are represented by identical reference numerals and the description thereof is simplified where appropriate.

FIG. 1A is a cross sectional view showing the structure of a semiconductor photoelectric conversion device according to an embodiment of the invention. A silicon substrate 10 has a p-type layer 2 on an n-type region 1, the p-type layer 2 being formed by epitaxial growth or ion implantation. The p-type layer 2 has therein an n-type region 3 constituting a photodiode and an n-type region 5 constituting a vertical charge transfer channel VCCD, respectively formed by ion implantation or the like.

A $p^+$-type region 4 burying the photodiode is being formed on the n-type region 3 by ion implantation or the like. A p-type region 6 is being formed on the bottom surface of the n-type region 5 by ion implantation or the like in order to electrically separate the vertical charge transfer channel VCCD. A $p^+$-type region 7 functioning as a channel stopper is being formed between adjacent columns.

The silicon substrate 10 has a silicon oxide film 11 formed on the surface thereof by thermal oxidation. A charge transfer electrode 12 of a so-called double polysilicon structure is being formed on the silicon oxide film 11 to drive the vertical charge transfer channel. The upper space of the photodiode is made open to introduce light. After the surface of the charge transfer electrode 12 is covered with a silicon oxide layer 14, a light shielding film 15 made of tungsten or the like and having a window above the photodiode is formed.

Figure 10B:
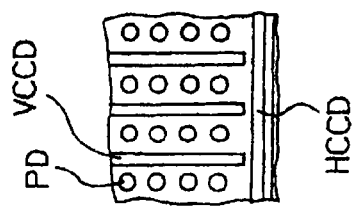
FIGS. 10A, 10B and 10C are a cross sectional view and schematic plan views showing the structure of a conventional semiconductor photoelectric conversion device.
Figure 10C:
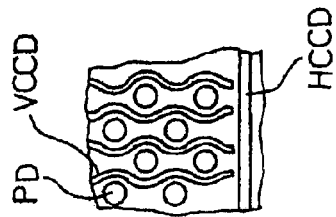
Figure 10A:
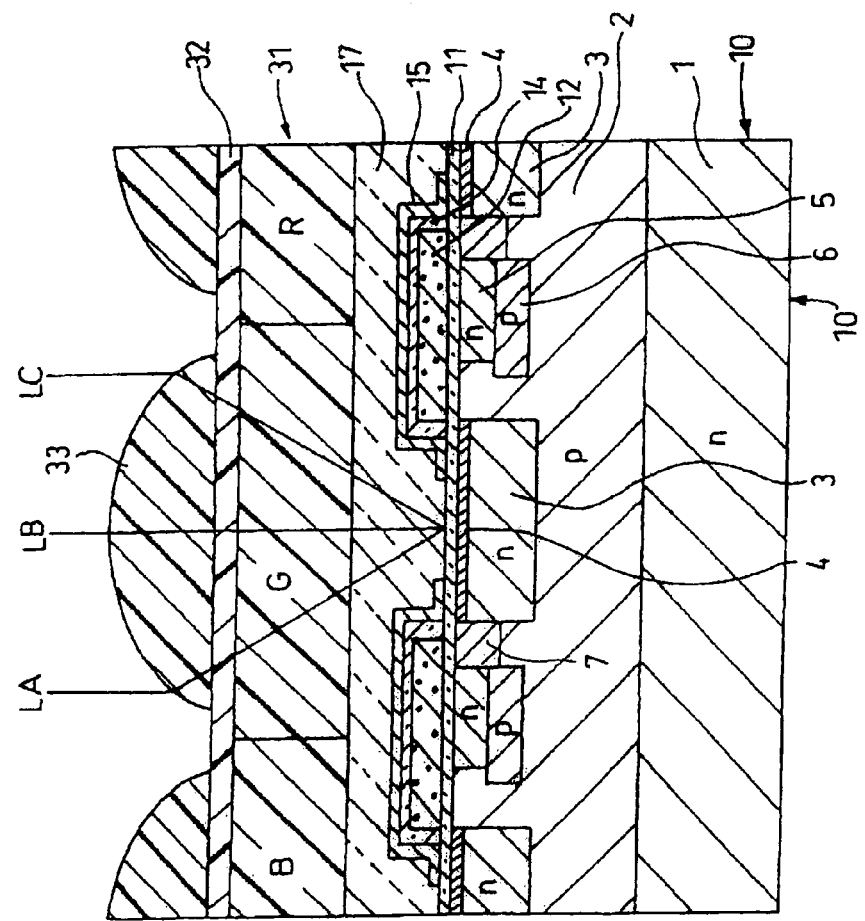
Figure 11:
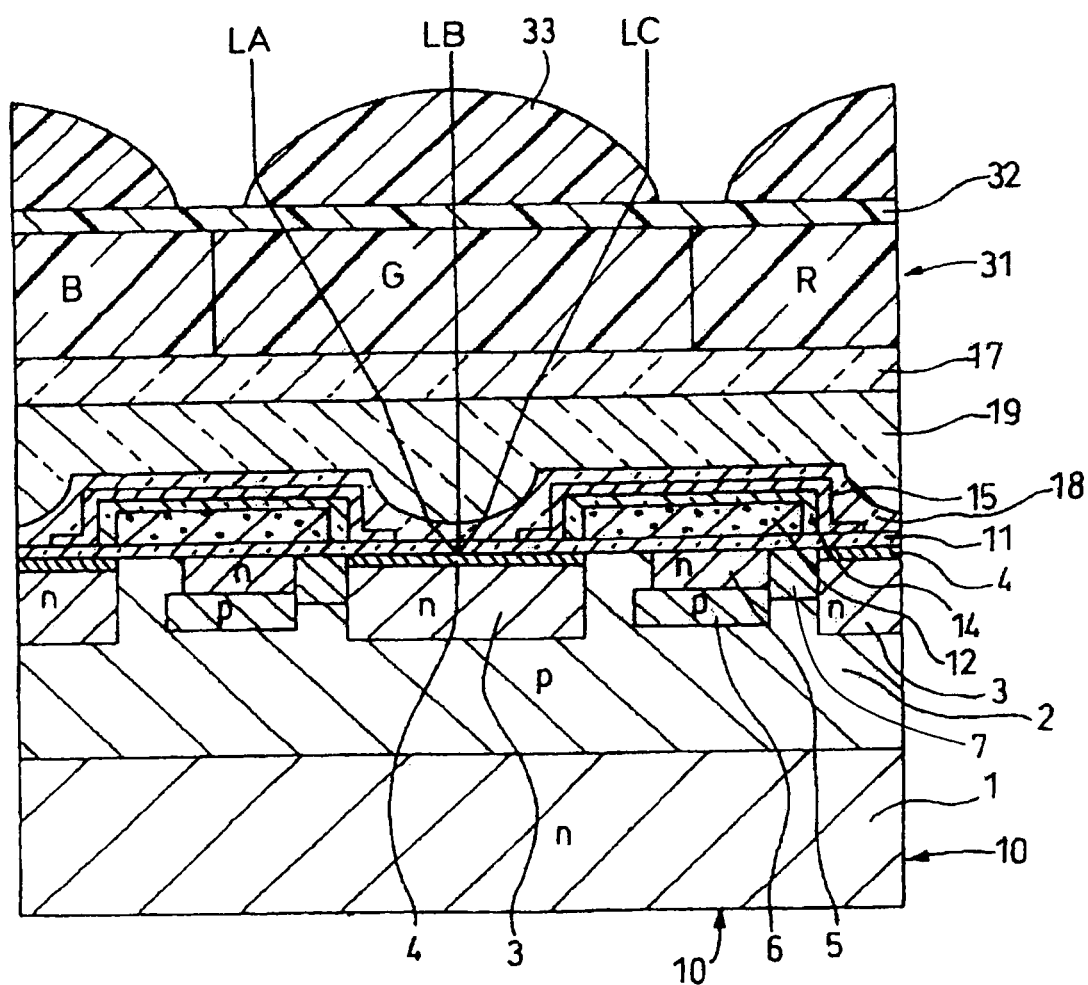
FIG. 11 is a schematic cross sectional view showing the structure of a conventional semiconductor photoelectric conversion device.
Figure 12A:
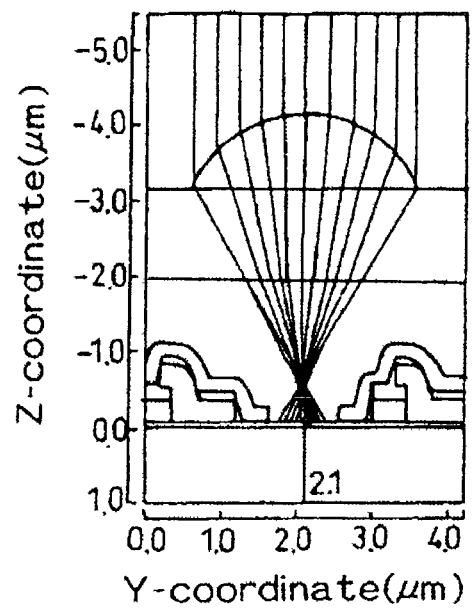
FIGS. 12A to 12D are graphs showing the results of optical path calculations when vertical incidence light and oblique incidence light are applied to the structures shown in FIG. 10A and FIG. 11.
Figure 12C:
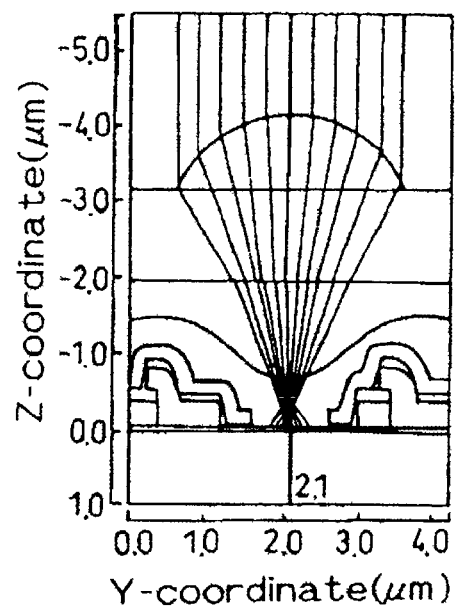
Figure 12B:
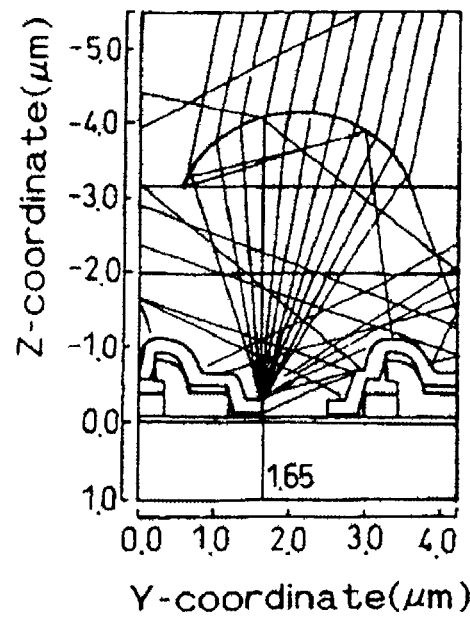
Figure 12D:
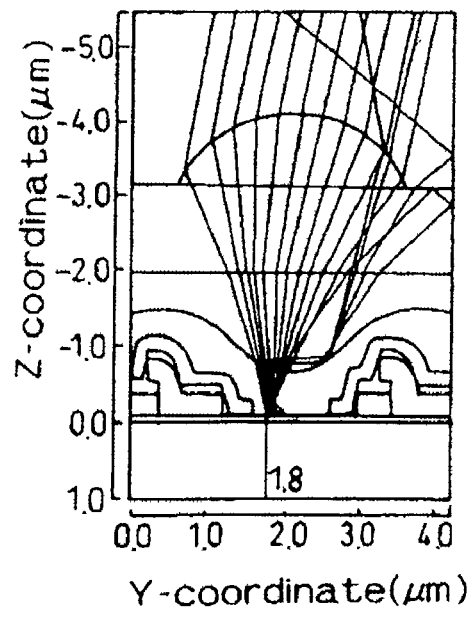

A transmissive material layer 21 having a higher refractive index than silicon oxide, e.g., silicon nitride having a refractive index of about 2, is formed burying the low step structure formed by the light shielding film 15. The high refractive index transmissive material layer 21 has a higher refractive index than silicon oxide frequently used as transmissive material, and has a function of enlarging the effective window size defined by the light shielding film 15 as will be described in the following. A transmissive insulating layer 17 having a flat surface and made of a boron—phosphorous—silicon oxide (borophosphosilicate glass (BPSG)) film or the like covers the silicon substrate 10. The layout of photodiodes may be a square matrix shape shown in FIG. 10B or a honeycomb shape shown in FIG. 10C. In this structure of the CCD semiconductor image pickup device, of the materials constituting the optical path, the high refractive index transmissive insulating layer 21 has a higher refractive index than other materials. In addition to silicon nitride, the high refractive index transmissive insulating layer 21 may be made of carbon material of the diamond structure, tantalum oxide or the like. If silicon nitride is used, it is preferably used in an amorphous phase.

A light flux can be converged into a point in terms of geometrical optics and can pass through a hole however small it is. However, since light is a wave, it spreads also in the plane perpendicular to the traveling direction. In terms of wave optics, there is a limit of the diameter of an opening through which light can pass. The opening is generally filled with transmissive insulating material such as silicon oxide. If the opening has a diameter of at most threefold of the wavelength of light in vacuum, it becomes necessary to consider the degree of light kicked at the edge of the opening. Generally, the light intensity is greatly attenuated when the light passes through the opening having a diameter similar to the wavelength of light in vacuum. Even if the diameter of an opening is about twofold of the wavelength of light in vacuum, attenuation cannot be neglected.

FIG. 1B shows a distribution of refractive indices near the light shielding film shown in FIG. 1A. Light having a wavelength $\lambda$ in vacuum has a wavelength $\lambda(n)=\lambda/n$ in medium having a refractive index n. The silicon oxide transmissive insulating layers 11, 17 have a refractive index of about 1.5. The high refractive index transmissive material layer 21 has a refractive index of about 2.

The wavelength $\lambda 2$ at the refractive index of 2 is about ¾ of the wavelengths $\lambda 1$, $\lambda 3$ at the refractive index of 1.5. The wavelength $\lambda 2$ of light in the high refractive index transmissive material layer 21 is therefore shorter than the wavelengths $\lambda 1$, $\lambda 3$ of lights in the transmissive insulating layers 17, 11. Even if the diameter of the opening of the light shielding film 14 becomes small, a ratio of the opening diameter to the wavelength can be maintained high. In other words, the high refractive index transmissive material layer functions to effectively enlarge the opening diameter. In this manner, it becomes possible to prevent the transmission factor from being lowered by a reduced opening diameter. Semiconductor such as silicon semiconductor has a high refractive index of 3 or higher so that a wavelength $\lambda 4$ in the semiconductor substrate 10 becomes shorter.

The high refractive index transmissive material layer 21 has a high refractive index so that the wavelength of light in the opening of the light shielding film 14 is effectively made short. If there is another medium having a different refractive index near the transmissive insulating film 17, the effective refractive index is an average of these refractive indices. It is possible to make large the ratio of the opening diameter to the wavelength and mitigate the limit to be caused by this ratio. From this viewpoint, the high refractive index transmissive material layer 21 has a function of shortening an effective wavelength. The effects of shortening the effective wavelength become distinctive if the opening diameter is set to at most threefold of the wavelength of light in vacuum, particularly to twofold or shorter.

FIG. 2 is a schematic cross sectional view of a semiconductor photoelectric conversion device according to another embodiment of the invention. In FIG. 2, like elements to those of the device shown in FIG. 1 are represented by using identical reference numerals and the description thereof is omitted. A high refractive index transmissive material layer 21 is made thicker than the high refractive index transmissive material layer shown in FIG. 1, and covers the whole surface of the silicon substrate 10. A color filter layer 31 of organic resin is formed on a transmissive insulating film 17, and a planarizing layer 32 of organic resin is formed on the color filter layer 31. A resist pattern is formed on the planarizing layer 32 and fluidized to form micro lenses 33.

Light LA, LB and LC incident upon the micro lens 33 is focused by the refractive function of the micro lens and converged into the opening of the light shielding film 15. The effective wavelength of light in the opening is shortened by the high refractive index insulating layer 21, and the limit by the ratio of the opening diameter to the wavelength can be mitigated.

Figure 3:
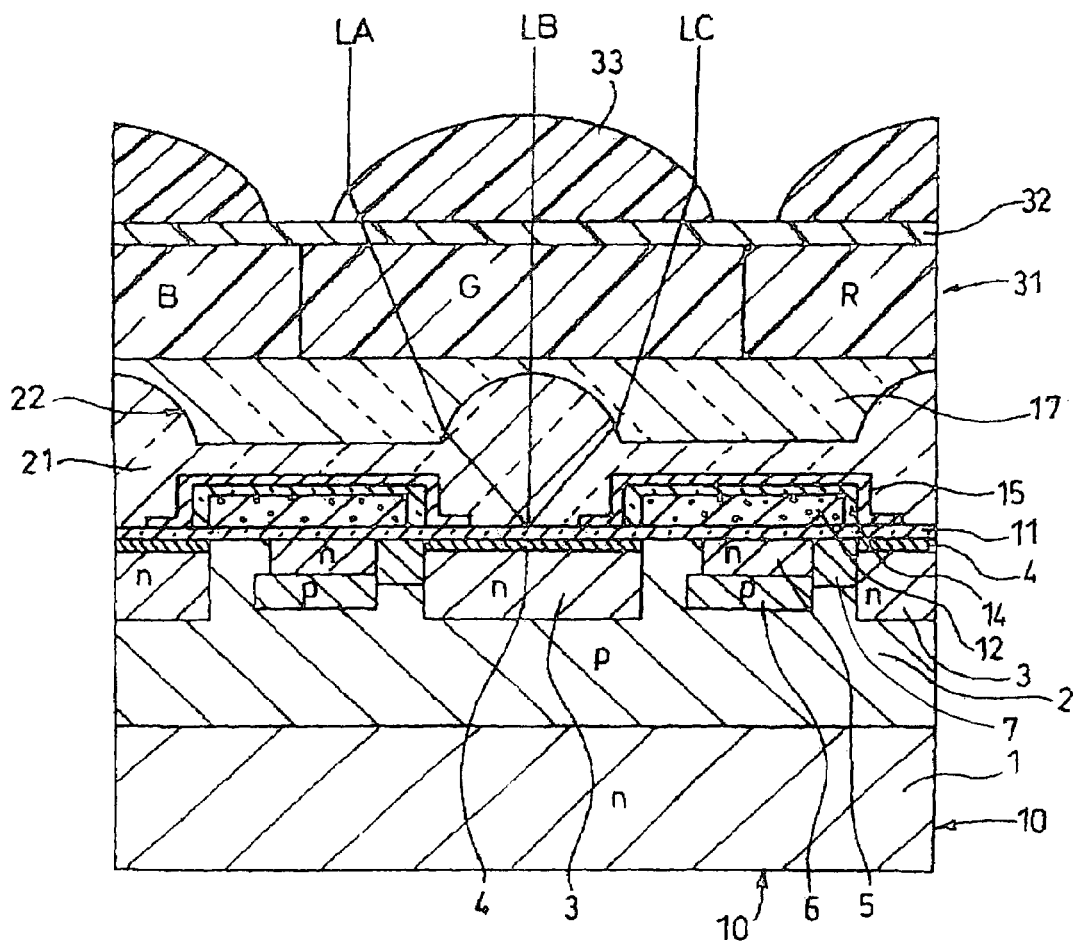
FIG. 3 is a schematic cross sectional view of a semiconductor photoelectric conversion device according to still another embodiment of the invention.

FIG. 3 is a cross sectional view of a semiconductor photoelectric conversion device according to still another embodiment of the invention. As compared to the structure shown in FIG. 2, the shape of the upper region of a high refractive index insulating layer 21 is different. The high refractive index insulating layer 21 has an upward convex spherical surface 22 which is protruded into a relatively low refractive index insulating film 17. In this manner, a convex lens (inner lens) is formed so that incidence light is focused. The micro lens 33 and the inner lens of the high refractive index material layer 21 allow incidence light to enter the photodiode more reliably.

In a semiconductor photoelectric conversion device using primary red (R), green (G) and blue (B) color filters, each photoelectric conversion element receives light in one of R, G and B wavelength ranges. R has the longest wavelength range, G has the middle wavelength range and B has the shortest wavelength range. The relation between the opening diameter and wavelength is most severe in R, gentle in G and most gentle in B. The same limit does not therefore exist in the whole wavelength range.

Figure 4:
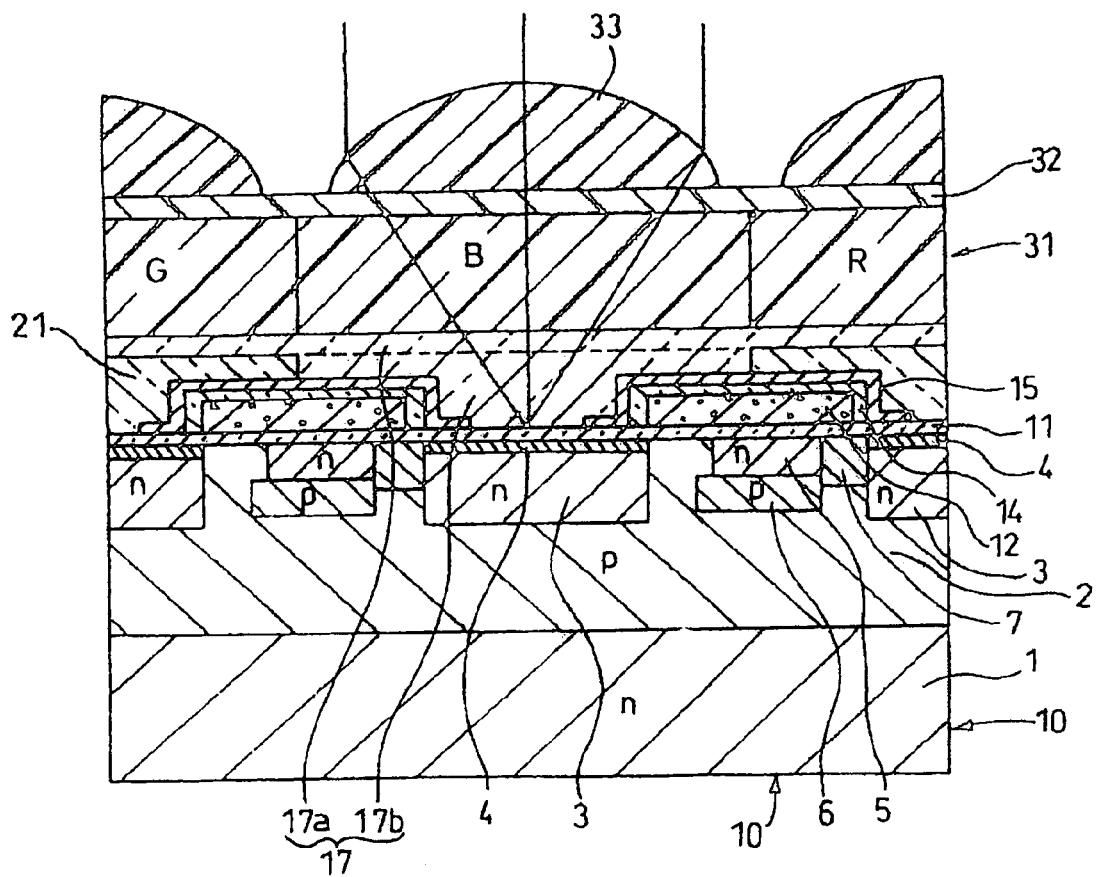
FIG. 4 is a schematic cross sectional view of a semiconductor photoelectric conversion device according to another embodiment of the invention.

FIG. 4 is a cross sectional view of a semiconductor photoelectric conversion device according to another embodiment of the invention. As compared to the structure shown in FIG. 2, under the color filter of blue (B), not a high refractive index transmissive material layer 21 but a relatively low refractive index transmissive insulating film 17b of BPSG or the like is buried. A transmissive insulating film 17 includes a region 17a higher than the high refractive index transmissive material layer 21 and the buried region 17b in the opening of the light shielding film under the blue filter. The limit by the ratio of the opening diameter to the wavelength is gentle in the blue wavelength range because of a short wavelength, and the incidence light is less limited even if the high refractive index transmissive material layer is not buried. The high refractive index transmissive material layer may be omitted not only in the blue wavelength range but also in the green wavelength range. In the longest red wavelength range, it is preferable to form the high refractive index transmissive material layer 21 to shorten the effective wavelength.

FIG. 5A is a cross sectional view of a semiconductor photoelectric conversion device according to an embodiment of the invention. On a light shielding film 15, a silicon oxide film 16 is formed surrounding an opening. The silicon oxide film 16 has a sidewall slanted relative to a surface insulating layer 11 in the opening. A high refractive index transmissive material layer 21 is filled in the opening defined by the silicon oxide film 16 and covers the surface of the silicon oxide film 16. Similar to the structure shown in FIG. 3, the high refractive index transmissive material layer 21 has an upward convex lens shape. The other structures are similar to those shown in FIG. 3. The high refractive index region 21 and low refractive index region 16 surrounding the high refractive region have the structure analogous to that of a core and a clad of an optical fiber.

FIG. 5B is a diagram illustrating how light travels at an interface between the high refractive index transmissive material layer 21 of silicon nitride or the like and the transmissive material layer 16 of silicon oxide or the like. Silicon nitride has a refractive index of about 2 and silicon oxide has a refractive index of about 1.5. At the interface between these different refractive index regions, a critical angle of total reflection is about 48.6 degrees. Light having an incidence angle larger than the critical angle is totally reflected. A light beam LD travels from the high refractive index transmissive material layer 21 toward the transmissive material layer 16 and is totally reflected at the interface.

In the structure shown, if the angle θ1 between vertical incidence light and the slanted surface is 90−48.6=41.4 or smaller, the vertical incidence light is totally reflected. In order to satisfy this condition, the angle θ2 between the interface and the substrate surface is set to 48.6 degrees or larger.

Figure 6:
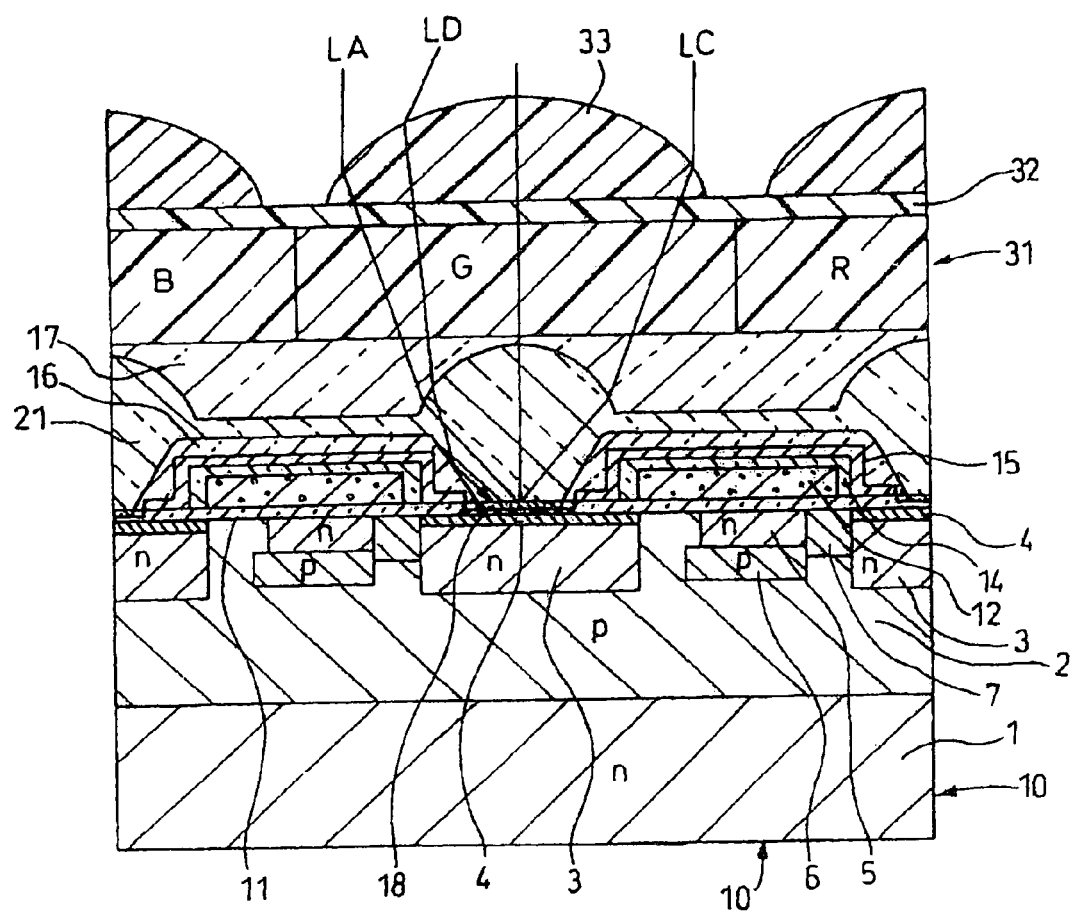
FIG. 6 is a schematic cross sectional view of a semiconductor photoelectric conversion device according to an improved modification of the embodiment shown in FIGS. 5A and 5B.

FIG. 6 is a schematic cross sectional view of a semiconductor photoelectric conversion device according to an improved modification of the embodiment shown in FIG. 5A. There is a high possibility that light traveling toward the interface between the high refractive index transmissive material layer 21 and silicon oxide layer 16 and totally reflected at the interface is also totally reflected at the interface between the surface insulating layer 11 and high refractive index transmissive material layer 21. In order to avoid this, between the high refractive index transmissive material layer 21 and surface insulating layer 11, an antireflection film 18 is formed which has a refractive index intermediate between silicon nitride and silicon oxide, e.g., silicon oxynitride. As the antireflection film having an intermediate refractive index is formed at the interface between two media, the critical angle of total reflection becomes large and the reflection factor lowers. It is therefore possible for incidence light to enter the photodiode more efficiently.

Figure 7:
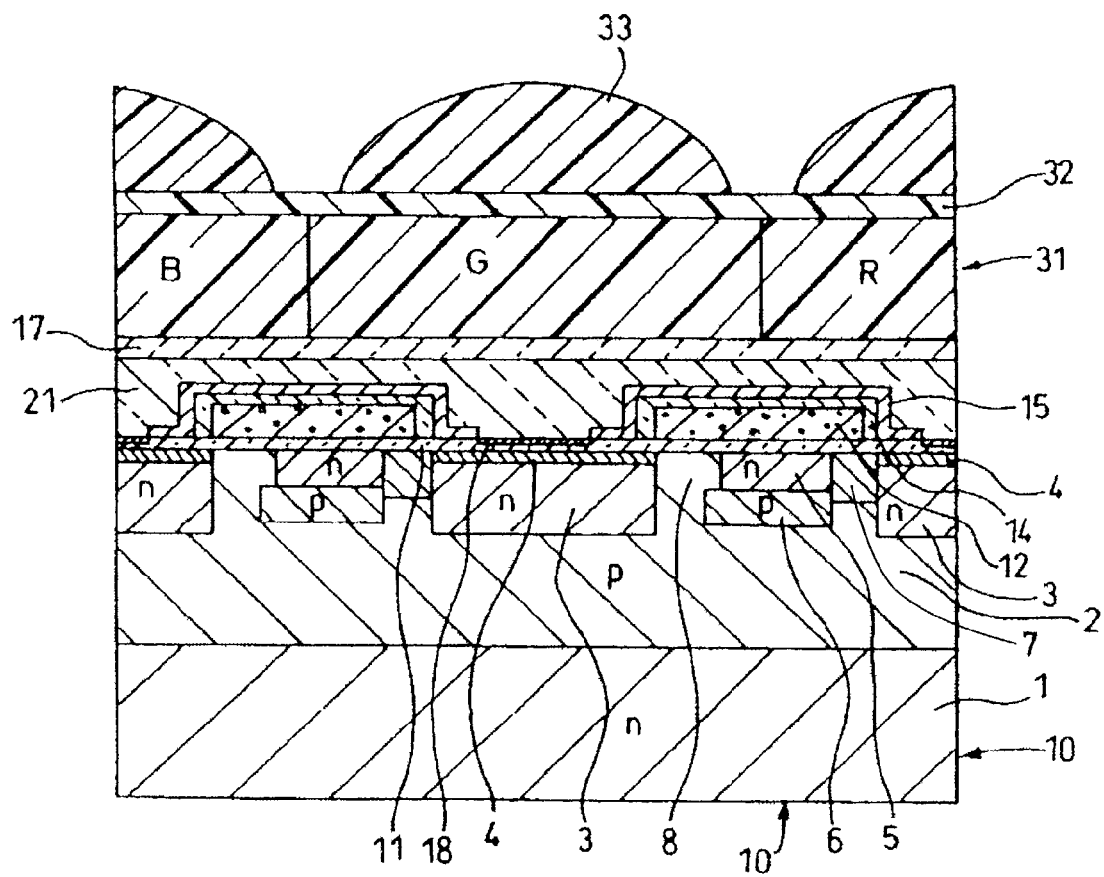
FIG. 7 is a schematic cross sectional view of a semiconductor photoelectric conversion device according to an improved modification of the embodiment shown in FIG. 2.

FIG. 7 is a schematic cross sectional view of a semiconductor photoelectric conversion device according to an improved modification of the embodiment shown in FIG. 2. In this embodiment, an antireflection film 18 is formed in the opening. This antireflection film 18 reduces the amount of light reflected at the surface insulating layer 11 so that more light can enter the photodiode.

Total reflection occurs when light travels from a high refractive index medium into a low refractive index medium.

Figure 8:
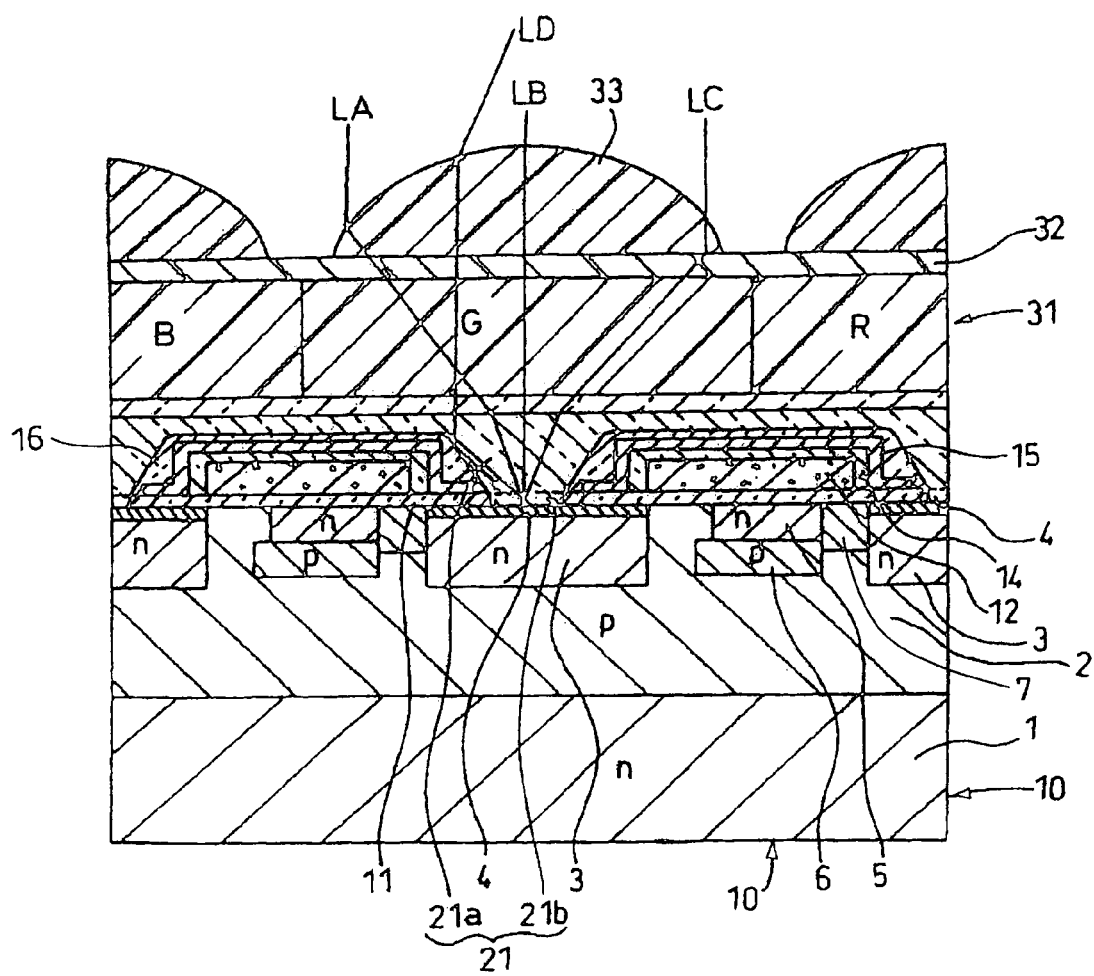
FIG. 8 is a schematic cross sectional view of a semiconductor photoelectric conversion device according to another embodiment of the invention.

FIG. 8 is a cross sectional view of a semiconductor photoelectric conversion device according to another embodiment of the invention. In this embodiment, the surface insulating layer 11 in contact with the high refractive index transmissive material layer 21 shown in the structure of FIG. 7 is removed. Namely, an opening is formed through the surface insulating layer 11 and a high refractive index transmissive material layer 21b is filled in this opening. The high refractive index transmissive material layer 21 includes the region 21a similar to the embodiment shown in FIG. 7 and the region 21b in contact with the substrate surface. The antireflection film in the structure shown in FIG. 7 is not used. Of silicon nitride and semiconductor substrate in direct contact, the semiconductor substrate has a higher refractive index. Therefore, total reflection of light traveling from the silicon nitride layer does not occur. It is possible for incidence light to enter efficiently into a photodiode. Also, a dielectric layer 16 having a lower refractive index than that of the high refractive index layer 21, similar to the layer 16 in FIG. 6, is provided.

A semiconductor photoelectric conversion device is not limited to a CCD type.

Figure 9:
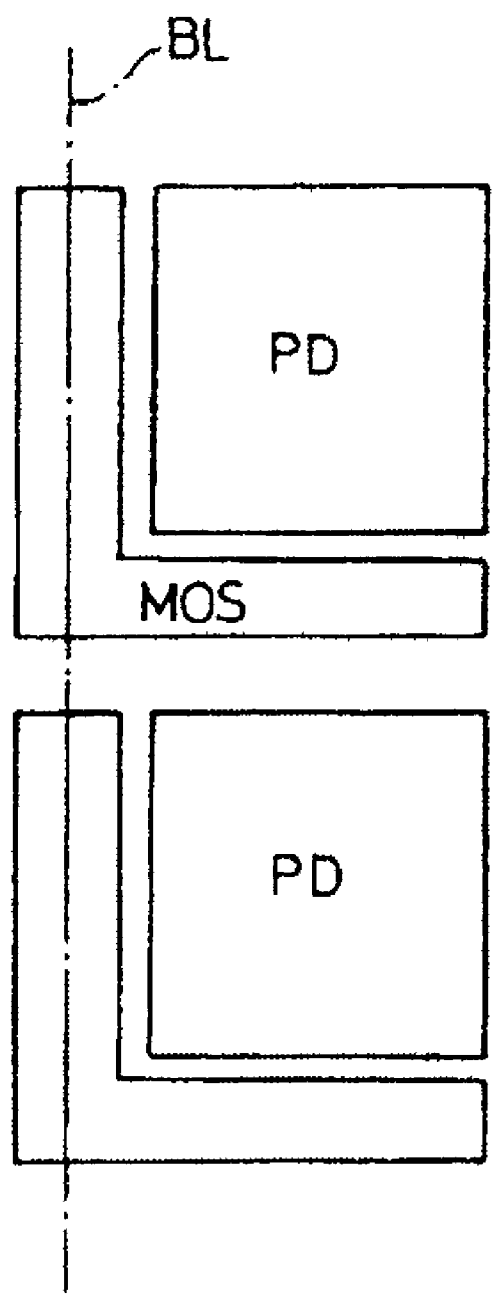
FIG. 9 is a schematic plan view showing the layout of a MOS photoelectric conversion device.

FIG. 9 is a schematic plan view showing the layout of a MOS photoelectric conversion device. In a MOS photoelectric conversion device, a MOS transistor circuit MOS for reading and amplifying charges is formed adjacent to a photodiode PD. An output signal is read from the MOS transistor circuit MOS to a bus line BL.

Also in a MOS photoelectric conversion device, a light shielding film having openings corresponding to photodiodes is formed on the surface of a semiconductor substrate and covers the peripheral area of photodiodes. The structures similar to the above-described embodiments can be applied to each opening of the light shielding film.

The present invention has been described in connection with the preferred embodiments. The invention is not limited only to the above embodiments. It is apparent to those skilled in the art that various modifications, improvements, combinations and the like can be made.

I claim:

1. A semiconductor photoelectric conversion device, comprising:
   a semiconductor substrate having a principal surface;
   a number of photoelectric conversion elements formed in the principal surface of said semiconductor substrate;
   a surface insulating film comprising a silicon oxide film, formed on the principal surface of said semiconductor substrate;
   functional devices formed on and in the principal surface of said semiconductor substrate adjacent to a number of said photoelectric conversion elements;
   a light shielding film formed above said semiconductor substrate to contact portions of said surface insulating film, said light shielding film shielding light above said functional devices and having windows for opening an upper space of a predetermined region of each of said photoelectric conversion elements;
   an effective wavelength shortening member filling a space defined by each of the windows of said light shielding film, occupying a space of low stepped structure formed by the light shielding film, being in direct contact with said surface insulating film, separated from an adjacent window, and being made of transmissive material having a refractive index higher than a refractive index of silicon oxide, in such a manner that an effective wavelength of light passing through the windows is shortened by insertion of the effective wavelength shortening member; and
   an antireflection film formed between said effective wavelength shortening member and said surface insulating layer, said antireflection film having a refractive index lower than the refractive index of said effective wavelength shortening member and higher than the refractive index of said surface insulating layer.

2. A semiconductor photoelectric conversion device according to claim 1, further comprising an insulating layer formed on said effective wavelength shortening member and having a refractive index lower than the refractive index of said effective wavelength shortening member.

3. A semiconductor photoelectric conversion device according to claim 2, wherein said insulating layer is made of silicon oxide.

4. A semiconductor photoelectric conversion device according to claim 2, wherein said effective wavelength shortening member is formed in direct contact with said light shielding film and disposed in the window from a lower to upper levels of said light shielding film.

5. A semiconductor photoelectric conversion device according to claim 2, wherein the window has a diameter of at most about threefold of a longest wavelength of object light in vacuum.

6. A semiconductor photoelectric conversion device according to claim 2, wherein the window has a diameter of at most about twofold of a longest wavelength of object light in vacuum.

7. A semiconductor photoelectric conversion device according to claim 1, further comprising a micro lens formed above said light shielding film and said effective wavelength shortening member for each of said photoelectric conversion elements.

8. A semiconductor photoelectric conversion device according to claim 7, wherein said micro lens has a focal point at a center of the window.

9. A semiconductor photoelectric conversion device according to claim 7, further comprising:
   a transmissive insulating layer formed under said micro lens and above said effective wavelength shortening member, said transmissive insulating layer having a refractive index lower than the refractive index of said effective wavelength shortening member; and
   a color filter disposed between each of said micro lenses and said transmissive insulating layer.

10. A semiconductor photoelectric conversion device according to claim 9, wherein said effective wavelength shortening member has a flat upper surface.

11. A semiconductor photoelectric conversion device according to claim 9, wherein an upper surface of said effective wavelength shortening member has an upward convex surface above said photoelectric conversion element, said transmissive insulating layer has a flat upper surface, and said effective wavelength shortening member has a function of a convex lens.

12. A semiconductor photoelectric conversion device according to claim 11, wherein the convex lens has a focal point at a center of the window.

13. A semiconductor photoelectric conversion device according to claim 7, further comprising a clad insulating layer formed between said light shielding film and said effective wavelength shortening member, said clad insulating layer having an inner side wall having a shape converging toward said photoelectric conversion element and a refractive index lower than the refractive index of said effective wavelength shortening member.

14. A semiconductor photoelectric conversion device according to claim 13, wherein said clad insulating layer is made of silicon oxide.

15. A semiconductor photoelectric conversion device comprising:
   a semiconductor substrate having a principal surface;
   a number of photoelectric conversion elements formed in the principal surface of said semiconductor substrate;
   functional devices formed on and in the principal surface of said semiconductor substrate adjacent to a number of said photoelectric conversion elements;
   a light shielding film formed above said semiconductor substrate, said light shielding film shielding light above said functional devices and having windows for opening an upper space of a predetermined region of each of said photoelectric conversion elements;
   an effective wavelength shortening member filling a space defined by each of the windows of said light shielding film, occupying a space of low stepped structure formed by the light shielding film, and being made of transmissive material having a refractive index higher than a refractive index of silicon oxide, in such a manner that an effective wavelength of light passing through the windows is shortened by insertion of the effective wavelength shortening member; and
   an antireflection film formed between said effective wavelength shortening member and said silicon oxide film, said antireflection film having a refractive index lower than the refractive index of said effective wavelength shortening member and higher than the refractive index of silicon oxide.

16. A semiconductor photoelectric conversion device according to claim 1, wherein said effective wavelength shortening member is made of silicon nitride.

17. A semiconductor photoelectric conversion device according to claim 16, wherein the silicon nitride is of an amorphous phase.

18. A semiconductor photoelectric conversion device according to claim 1, wherein said effective wavelength shortening member is made of carbon material of diamond structure or tantalum oxide.

19. A semiconductor photoelectric conversion device according to claim 1, wherein said light shielding film is made of tungsten.

20. The semiconductor photoelectric conversion device according to claim 4, wherein the light shielding film is made of tungsten, and the effective wavelength shortening member is a silicon nitride film deposited directly on the light shielding film.

21. The semiconductor photoelectric conversion device according to claim 4, wherein the top surface of the wavelength shortening member is flat.

22. The semiconductor photoelectric conversion device according to claim 4, wherein the top surface of the wavelength shortening member is convex.

* * * * *